United States Patent
Kim

(10) Patent No.: US 11,251,381 B2
(45) Date of Patent: Feb. 15, 2022

(54) DISPLAY DEVICE

(71) Applicant: SAMSUNG DISPLAY CO., LTD., Yongin-si (KR)

(72) Inventor: Cheol-Su Kim, Gyeonggi-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 453 days.

(21) Appl. No.: 15/413,653

(22) Filed: Jan. 24, 2017

(65) Prior Publication Data

US 2017/0133449 A1 May 11, 2017

Related U.S. Application Data

(63) Continuation-in-part of application No. 14/069,461, filed on Nov. 1, 2013, now Pat. No. 9,564,477.

(30) Foreign Application Priority Data

Jun. 7, 2013 (KR) .................. 10-2013-0065471

(51) Int. Cl.
*H01L 51/00* (2006.01)
*H01L 27/32* (2006.01)
*H01L 27/12* (2006.01)

(52) U.S. Cl.
CPC ........ *H01L 51/0097* (2013.01); *H01L 27/326* (2013.01); *H01L 27/3218* (2013.01); *H01L 27/1214* (2013.01); *H01L 27/3244* (2013.01); *H01L 2227/323* (2013.01); *H01L 2251/5323* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2004/0051944 A1 * | 3/2004 | Stark | G02F 1/13336 359/448 |
| 2004/0124763 A1 | 7/2004 | Nathan et al. | |
| 2007/0262916 A1 * | 11/2007 | Kee | G02F 1/13336 345/1.3 |
| 2009/0219225 A1 | 9/2009 | Cope | |
| 2011/0175101 A1 | 7/2011 | Hatano et al. | |
| 2013/0002133 A1 | 1/2013 | Jin et al. | |
| 2014/0361262 A1 | 12/2014 | Kim | |

FOREIGN PATENT DOCUMENTS

| | | |
|---|---|---|
| CN | 102855821 | 1/2013 |
| KR | 1020060001661 | 1/2006 |
| KR | 1020100086884 | 8/2010 |

* cited by examiner

*Primary Examiner* — Shaun M Campbell
*Assistant Examiner* — Aneta B Cieslewicz
(74) *Attorney, Agent, or Firm* — F. Chau & Associates, LLC

(57) ABSTRACT

A flexible display device includes a substrate, a plurality of first pixels, and a plurality of second pixels. The substrate includes a foldable bending region and a non-foldable non-bending region. Each first pixel is disposed on the bending region. Each first pixel is spaced apart from an adjacent first pixel by a first distance. Each second pixel is disposed on the non-bending region. Each second pixel is spaced apart from an adjacent second pixel by a second distance. The first distance is greater than the second distance.

10 Claims, 12 Drawing Sheets

DISPLAY DEVICE

CROSS-REFERENCE TO RELATED PATENT APPLICATION

This application is continuation application of U.S. application Ser. No. 14/069,461 filed on Nov. 1, 2013, which claims priority under 35 U.S.C. § 119 to Korean Patent Application No. 10-2013-0065471, filed on Jun. 7, 2013 in the Korean Intellectual Property Office, the disclosure of which is incorporated by reference herein in its entirety.

TECHNICAL FIELD

The present invention relates to a flexible display device and a method of fabricating the same.

DISCUSSION OF RELATED ART

Flexible display devices may be bent, displaying images. Flexible display devices maintain their bent shape by using a flexible substrate. Bending regions of flexible display devices need to have resistance to cracks or other mechanical defects due to such bent shape.

SUMMARY OF THE INVENTION

According to an exemplary embodiment of the present invention, a flexible display device includes a substrate, a plurality of first pixels, and a plurality of second pixels. The substrate includes a foldable bending region and a non-foldable non-bending region. Each first pixel is disposed on the bending region. Each first pixel is spaced apart from an adjacent first pixel by a first distance. Each second pixel is disposed on the non-bending region. Each second pixel is spaced apart from an adjacent second pixel by a second distance. The first distance is greater than the second distance.

According to an exemplary embodiment of the present invention, a flexible display device includes a substrate, a plurality of driving thin film transistors, a plurality of first pixels, and a plurality of second pixels. The substrate includes a foldable bending region and a non-foldable non-bending region. Each driving thin film transistors is disposed on the substrate. Each driving thin film transistor includes a semiconductor layer extended in a first direction. Each first pixel is disposed on the bending region. Each first pixel is spaced apart from an adjacent first pixel by a first distance along a second direction crossing the first direction. Each second pixel is disposed on the non-bending region. Each second pixel is spaced apart from an adjacent second pixel by a second distance along the second direction. Each first pixel is disposed on a corresponding driving thin film transistor, and each second pixel is disposed on a corresponding driving thin film transistor. The first distance is greater than the second distance.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE INVENTION

Figure 1:
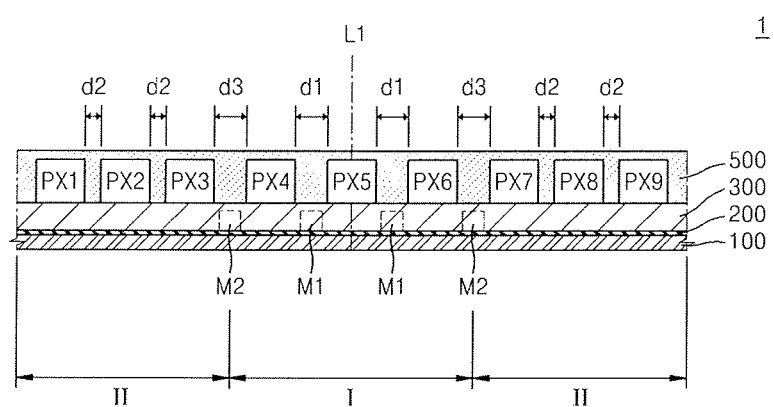
FIG. 1 is a cross-sectional view illustrating a distance between pixels in a bending region I and a non-bending region II of a flexible display device, according to an exemplary embodiment of the present invention.

Exemplary embodiments of the present invention will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening elements may also be present. It will also be understood that when an element is referred to as being "coupled" to another element, it may be directly coupled to the other element, or intervening elements may also be present. Like reference numerals may refer to the like elements throughout the specification and drawings.

Figure 2:
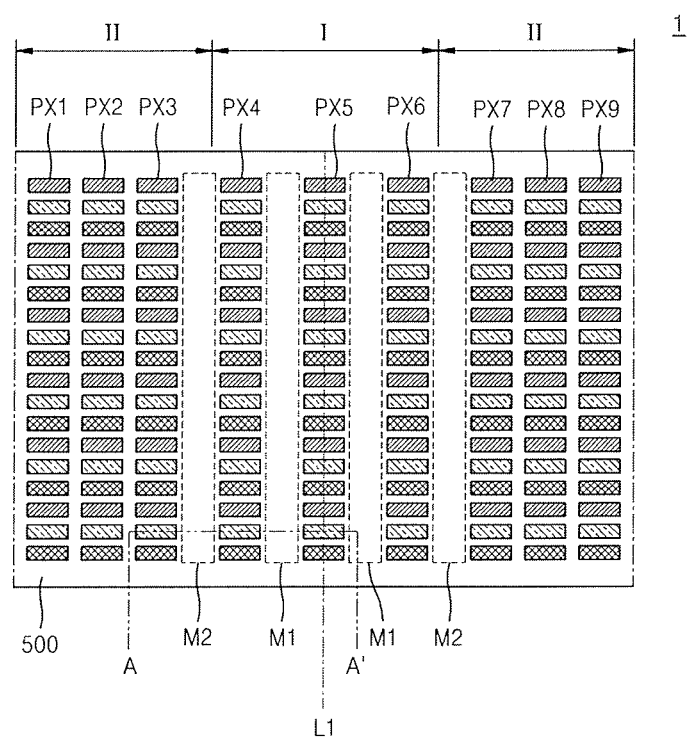
FIG. 2 is a plan view of the flexible display device of FIG. 1.
Figure 3:
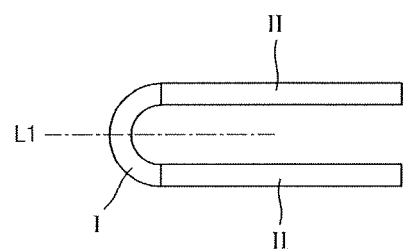
FIG. 3 is a side view illustrating a folded shape of the flexible display device of FIG. 2.

FIG. 1 is a cross-sectional view illustrating a distance between pixels in a bending region I and a non-bending region II of a flexible display device 1, according to an exemplary embodiment of the present invention. FIG. 2 is a plan view of the flexible display device 1 of FIG. 1. FIG. 3 is a side view illustrating a folded shape of the flexible display device 1 of FIG. 2.

The flexible display device 1 according to an exemplary embodiment of the present invention includes the bending region I and the non-bending region II. A first distance d1 is a distance between pixels PX4, PX5, and PX6 disposed in the bending region I. A second distance d2 is a distance between pixels PX1, PX2, PX3, PX7, PX8, and PX9 disposed in the non-bending region II. The first distance d1 is greater than the second distance d2. A process margin may be obtained to remove insulating layers formed underneath between the pixels PX4, PX5, and PX6 of the bending region I.

Figure 4:
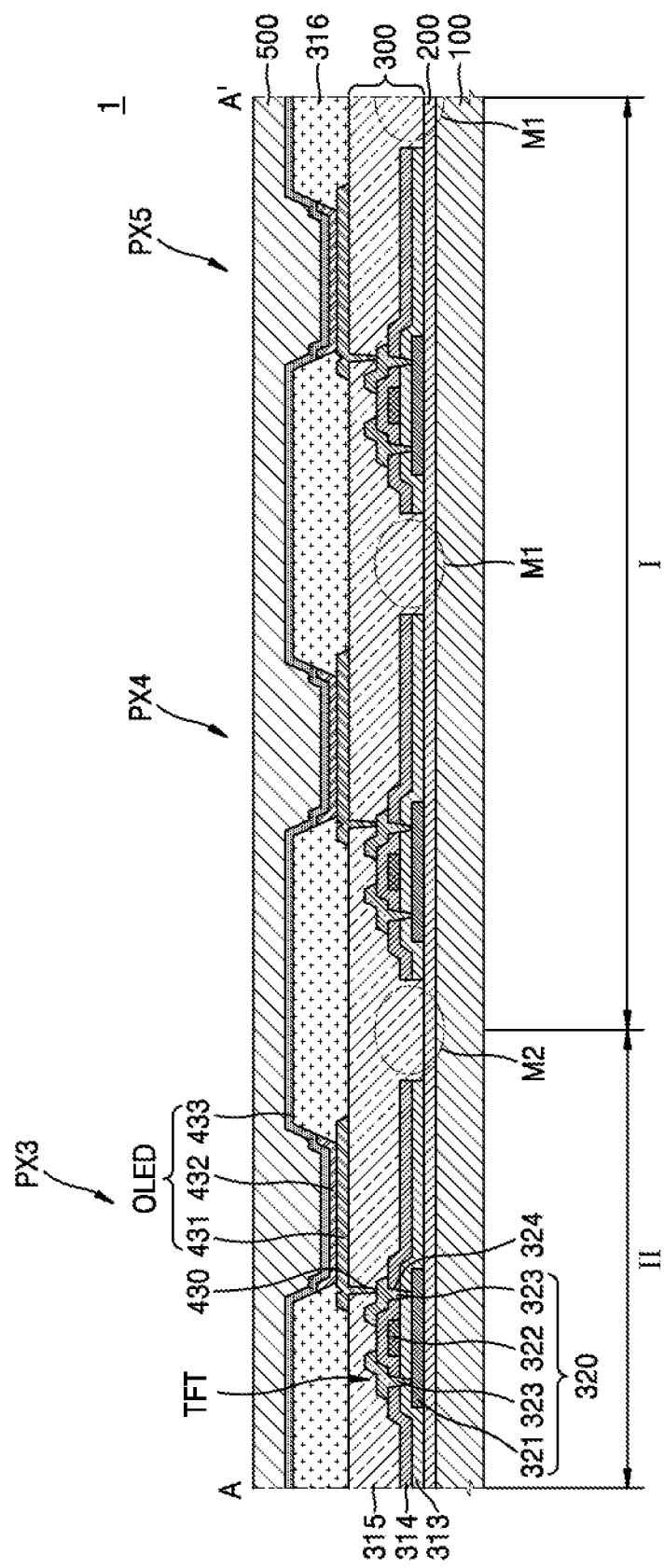
FIG. 4 is a cross-sectional view taken along line A-A' of FIG. 2.

Therefore, gate and interlayer insulating layers 313 and 314 of FIG. 4 may be removed underneath between the pixels PX4, PX5, and PX6 of the bending region I. Removal of the insulating layers 313 and 314 may reduce stress occurring in the bending region I when the flexible display device 1 is folded, thereby increasing the bending reliability of the flexible display device 1.

Referring to FIGS. 1 through 3, the flexible display device 1 according to an exemplary embodiment of the present invention includes a flexible substrate 100, a buffer layer 200 formed on the flexible substrate 100, an element/wiring layer 300 including a plurality of thin film transistors (not shown) formed on the buffer layer 200, a plurality of pixels PX1 to PX9 formed in the element/wiring layer 300, and a sealing layer 500 formed to cover the plurality of pixels PX1 to PX9.

The flexible substrate 100 includes the bending region I and the non-bending region II. The bending region I is a foldable region, and the non-bending region II is a non-foldable region. The flexible display device 1 is folded along a base line L1 of the bending region I. For example, the bending region I has a symmetrical bending shape.

The non-bending region II provides at least a flat region and may be evenly formed without a bending region throughout.

The flexible substrate 100 is formed of a flexible material.

The buffer layer 200 is disposed on the flexible substrate 100. The buffer layer 200 prevents external bodies, such as moisture or oxygen, from penetrating into the element/wiring layer 300 and/or the plurality of pixels PX1 to PX9 through the flexible substrate 100.

The element/wiring layer 300 is disposed on the buffer layer 200. The element/wiring layer 300 may include a driving thin film transistor (TFT) driving the plurality of pixels PX1 to PX9, a switching TFT (not shown), a capacitor, and wirings (not shown) connected to the TFTs or the capacitor.

The plurality of pixels PX1 to PX9 is formed in the element/wiring layer 300.

The plurality of pixels PX1 to PX9 include a first pixel portion PX4, PX5, and PX6 formed in the bending region I and a second pixel portion PX1, PX2, PX3, PX7, PX8, and PX9 formed in the non-bending region II. The size of the plurality of pixels PX1 to PX9 formed in the bending region I and the non-bending region II may be the same.

According to an exemplary embodiment of the present invention, the first distance d1 is the same or greater than the second distance d2. A third distance d3 between pixels PX4 and PX6 formed in a boundary portion of the bending region I and pixels PX3 and PX7 formed in a boundary portion of the non-bending region II is greater than the second distance d2. In addition, the third distance d3 may be the same or less than the first distance d1.

The first distance d1 is greater than the second distance d2 so that a process margin is secured to remove the gate and the interlayer insulating layers 313 and 314 of FIG. 4 formed underneath between the pixels PX4, PX5, and PX6 of the first pixel portion.

Using a photolithography process using a mask, the pixels PX4, PX5, and PX6 of the bending region I are formed to have the first distance d1, and t the pixels PX1, PX2, PX3, PX7, PX8, and PX9 of the non-bending region II are formed to have the second distance d2. When the first and second distances d1 and d2 are physically set to be different, a distance between the TFTs of the element/wiring layer 300, the TFT driving the pixels of the first pixel portion PX4, PX5, and PX6 and the second pixel portion PX1, PX2, PX3, PX7, PX8, and PX9 is set to be different.

For example, since the first distance d1 between the pixels PX4, PX5, and PX6 of the bending region I is greater than the second distance d2 between the pixels of the non-bending region II, the distance between the driving TFTs of the pixels of the bending region I in the element/wiring layer 300 may be greater than the distance between the driving TFTs of the pixels of the non-bending region II.

For simplicity of description, 3 pixels of the bending region I and 6 pixels of the non-bending region II are used as an example to describe the embodiment of the present invention, but the present invention is not limited thereto. The number of pixels may vary according to a size of the flexible display device 1, and an area and a folding degree of the bending region I.

A first region M1 is a region from which the gate and the interlayer insulating layers 313 and 314 of FIG. 4 formed underneath between the pixels PX4, PX5, and PX6 of the first pixel portion of the bending region I are removed. Also, the flexible display device 1 may further include a second region M2 from which the gate and the interlayer insulating layers 313 and 314 of FIG. 4 are removed underneath between the pixels PX3 and PX4 formed in the boundary portion of the bending region I and the pixels PX6 and PX7 formed in the boundary portion of the non-bending region II.

FIG. 4 is a cross-sectional view taken along line A-A' of FIG. 2.

Referring to FIG. 4, the driving TFT formed in the element/wiring layer 300 includes a semiconductor layer 321, a gate electrode 322, and source and drain electrodes 323. The driving TFT of FIG. 4 is a top gate type TFT. Alternatively, other types of TFTs, such as a bottom gate type TFT, may be formed. Hereinafter, the top gate type TFT of FIG. 4 will be described.

The semiconductor layer 321, a gate insulating layer 313, the gate electrode 322, an interlayer insulating layer 314, a contact hole 324, and the source and drain electrodes 323 are sequentially formed on the buffer layer 200 to form the top gate type TFT of FIG. 4.

The semiconductor layer 321 may be formed of polysilicon doped with impurities. Alternatively, the semiconductor layer 321 may be formed of amorphous silicon instead of polysilicon, and may further be formed of various organic semiconductor materials, such as pentacene.

When the semiconductor layer 321 is formed of polysilicon, amorphous silicon is formed and then is crystallized into polysilicon using a crystallization method. The crystallization method may include, but are not limited to, rapid thermal annealing (RTA), solid phase crystallization (SPC), excimer laser annealing (ELA), metal-induced crystallization (MIC), metal-induced lateral crystallization (MILC), or sequential lateral solidification (SLS). When a plastic substrate is used, methods that do not require a high temperature thermal process may be used.

The gate insulating layer 313 is formed between the semiconductor layer 321 and the gate electrode 322. The gate insulating layer 313 may be formed of an insulating material, such as silicon oxide or silicon nitride. The gate insulating layer 313 may also be formed of an insulating organic material.

The gate electrode 322 may be formed of various conductive materials including, but are not limited to, magnesium (Mg), aluminium (Al), nickel (Ni), chromium (Cr), molybdenum (Mo), tungsten (W), molybdenum-tungsten (MoW), or gold (Au). The gate electrode 322 may be formed in a single layer or multiple layers.

The interlayer insulating layer 314 may be formed of an insulating material, such as silicon oxide or silicon nitride, and may also be formed of an insulating organic material.

The source and drain electrodes 323 are formed by selectively removing the interlayer insulating layer 314 and the gate insulating layer 313. The source and drain electrodes 323 are formed of a gate electrode material on the interlayer insulating layer 314 in a single layer or multiple layers.

Also, in a process of forming the contact hole 324 to form the source and drain electrodes 323, the interlayer insulating layer 314 and the gate insulating layer 313 may be removed underneath between the pixel PX4 and the pixel PX5 of the bending region I. A region of the bending region I, from which the interlayer insulating layer 314 and the gate insulating layer 313 are removed, corresponds to the first region M1 of FIGS. 1 and 2.

In addition, the interlayer insulating layer 314 and the gate insulating layer 313 may be removed underneath between the pixel PX3 of the non-bending region II and the pixel PX4 of the bending region I. A region from which the interlayer insulating layer 314 and the gate insulating layer 313 are removed in a boundary portion of the bending region I and the non-bending region II corresponds to the second region M2 of FIGS. 1 and 2.

Since the gate and the interlayer insulating layers 313 and 314 are removed underneath between the pixel PX4 and the pixel PX5 formed in the bending region I, stress intensity occurring when the bending region I is folded or bent may be minimized, thereby increasing the reliability of the flexible display device 1. In addition, the gate and the interlayer insulating layers 313 and 314 may also be removed underneath between the pixel PX3 of the non-bending region II and the pixel PX4 of the bending region I, thus the reliability of the flexible display device 1 may be increased.

To protect and planarize the TFT below, a planarization layer 315 (a protective layer and/or a passivation layer) is included on the source and drain electrodes 323 and in first and second regions M1 and M2 exposing a top of the buffer layer 200. The planarization layer 315 may be formed in various forms, and may be formed of an organic material, such as benzocyclobutene (BCB) or acryl, or may be formed of an inorganic material, such as SiNx. Also, the planarization layer 315 may be formed in a single layer, double layers or multiple layers. The plurality of pixels PX3, PX4, and PX5 disposed on the element/wiring layer 300 includes a first electrode 431, an intermediate layer 432 disposed on the first electrode 431, and a second electrode 433 formed on the intermediate layer 432.

The first electrode 431 is an anode, and the second electrode 433 is a cathode. However, the present invention is not limited thereto, and the first electrode 431 may be a cathode and the second electrode 433 may be an anode, according to a driving method of the flexible display device 1. Holes and electrons are injected into the intermediate layer 432 from the first electrode 431 and the second electrode 433. Excitons, which are a bound state of the holes and the electrons that are injected, emit light when falling from an excited state to a ground state.

The first electrode 431 is electrically connected to the driving TFT formed in the element/wiring layer 300.

The plurality of pixels PX3, PX4, and PX5 is disposed on the element/wiring layer 300, on which the driving TFT is disposed, but the present invention is not limited thereto.

The first electrode 431, included in the plurality of pixels PX3, PX4, and PX5, according to the embodiment of the present invention, may be a reflection electrode. The first electrode 431 may include a reflective layer formed of silver (Ag), magnesium (Mg), aluminium (Al), platinum (Pt), palladium (Pd), gold (Au), nickel (Ni), neodymium (Nd), iridium (Ir), chromium (Cr), and a compound thereof, and a transparent or semi-transparent electrode layer formed on the reflective layer.

The transparent or semi-transparent electrode layer may include, but is not limited to, indium tin oxide (ITO), indium zinc oxide (IZO), zinc oxide (ZnO), indium oxide ($In_2O_3$), indium gallium oxide (IGO), or aluminium zinc oxide (AZO).

The second electrode 433 that is disposed to face the first electrode 431 may be a transparent or semi-transparent electrode. The second electrode 433 may be formed of a thin metal film having a low work function, including lithium (Li), calcium (Ca), LiF/Ca, LiF/Al, aluminium (Al), silver (Ag), magnesium (Mg), or a compound thereof. An auxiliary electrode layer or a bus electrode may further be formed on the second electrode 433. The auxiliary electrode may be formed of a material for forming a transparent electrode, such as ITO, IZO, ZnO, or $In_2O_3$.

Thus, the second electrode 433 may transmit light emitted from the pixels PX3, PX4, and PX5.

The intermediate layer 432 disposed between the first electrode 431 and the second electrode 433 may be a small molecular weight organic material or a high molecular weight organic material.

In addition to the intermediate layer 432, a hole transport layer (HTL), a hole injection layer (HIL), an electron transport layer (ETL), and an electron injection layer (EIL) may be selectively disposed between the first electrode 431 and the second electrode 433.

Light emitted from the intermediate layer 432 may be a top emission-type, emitted upwards towards the second electrode 433 by reflection by the first electrode 431 formed as an electrode or a reflection electrode.

However, the flexible display device 1 according to an exemplary embodiment of the present invention is not limited to a top emission-type, and may be a bottom emission-type emitting light emitted from the intermediate layer 432 to the flexible substrate 100. In this case, the first electrode 431 may be formed of a transparent or a semi-transparent electrode while the second electrode 433 may be formed of a reflection electrode.

Also, the flexible display device 1 may be a dual-emission-type emitting light in both top and bottom directions.

A sealing layer 500 is disposed on the second electrode 433. The sealing layer 500 serves to prevent external moisture and oxygen from penetrating into the pixels PX3, PX4, and PX5. The sealing layer 500 may be formed by stacking at least one organic layer and at least one inorganic layer alternately.

The number of inorganic layers or organic layers may be plural respectively.

The organic layer is formed as a polymer, and may be a single layer or stacked layers formed of any of polyethylene ether phthalate, polyimide (PI), polycarbonate (PC), epoxy, polyethylene, and polyacrylate (PAR). The organic layer may be formed of polyacrylate (PAR), and for example, may include a polymerized monomer composition including a diacrylate monomer and a triacrylate monomer. The monomer composition may further include a monoacrylate monomer. Also, the monomer composition may further include a photoinitiator that is well known to those of ordinary skill in the art, such as thermoplastic polyolefin (TPO), but it is not limited thereto.

The inorganic layer may be a single layer or stacked layers including metal oxide or metal nitride. The inorganic layer may include any of SiNx, $Al_2O_3$, $SiO_2$, and $TiO_2$, for example.

The sealing layer 500 has a top portion exposed to the outside. The top portion may be formed of an inorganic layer to waterproof an organic light-emitting device.

The sealing layer 500 may include at least one sandwich structure in which at least one organic layer is inserted between at least two inorganic layers. Also, the sealing layer 500 may include at least one sandwich structure in which at least one inorganic layer is inserted between at least two organic layers.

The sealing layer 500 is disposed on the second electrode 433. The sealing layer 500 may include a first inorganic layer, a first organic layer, and a second inorganic layer. The sealing layer 500 may further include a second organic layer, and a third inorganic layer. The sealing layer 500 may further include a third organic layer, and a fourth inorganic layer.

A halogenated metal layer, including LiF, may further be included between the second electrode 433 and the first inorganic layer. The halogenated metal layer may prevent the pixels PX3, PX4, and PX5 from being damaged due to a sputtering or plasma deposition process for forming the first inorganic layer.

The first organic layer may have a smaller area than the second inorganic layer, and the second organic layer may have a smaller area than the third inorganic layer. Also, the first organic layer may be completely covered by the second inorganic layer, and the second organic layer may be completely covered by the third inorganic layer.

FIGS. 5 through 14 are cross-sectional views illustrating a method of fabricating a flexible display device, according to an exemplary embodiment of the present invention.

Figure 5:
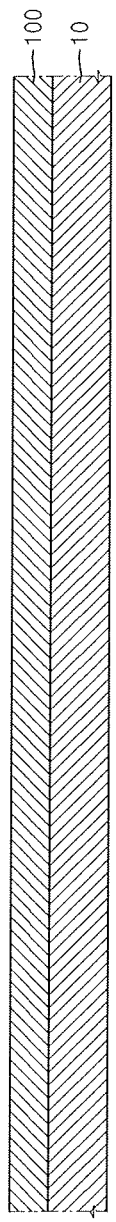
FIGS. 5 through 14 are cross-sectional views illustrating a method of fabricating a flexible display device, according to an exemplary embodiment of the present invention.

Referring to FIG. 5, the flexible substrate 100 is formed on a support substrate 10.

The support substrate 10 is separated from the flexible substrate 100 by laser beam radiation or chemical solution in a separation process to be described later.

The support substrate 10 may be a glass substrate. Alternatively, the support substrate 10 may be various substrates, such as a transparent plastic substrate or a metal substrate, that support the flexible substrate 100 and endure a process stress due to a process of forming elements and wirings on the flexible substrate 100, may be used.

The flexible substrate 100 may be formed of a plastic material that is bendable and that has high thermal resistance and durability. For example, the plastic material may include, but is not limited to, polyethylene ether phthalate, polyethylene naphthalate (PEN), polycarbonate (PC), polyallylate, polyetherimide (PEI), polyethersulphone (PES), or polyimide (PI).

Although it is not shown in FIG. 5, a separation layer (not shown) may be formed between the support substrate 10 and the flexible substrate 100. The separation layer may be formed of various materials that are suitable for methods applied in the separation process.

Figure 6:
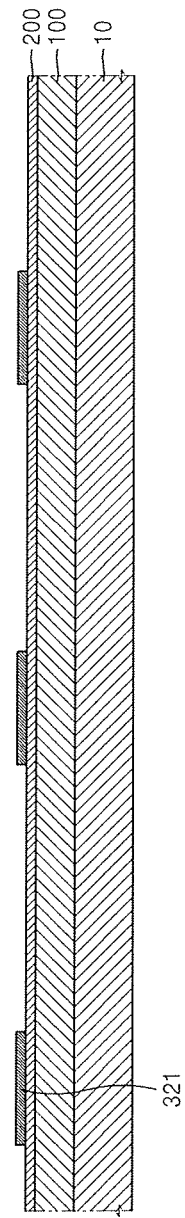

Referring to FIG. 6, the buffer layer 200 is formed on the top of the flexible substrate 100. The buffer layer 200 may be formed of at least one of an inorganic layer and an organic layer. The buffer layer 200 facilitates crystallization of a semiconductor by preventing a diffusion of moisture or impurities into the flexible substrate 100, or by controlling heat transmission speed during a crystallization process.

Next, the semiconductor layer 321 is formed on the buffer layer 200.

The semiconductor layer 321 may be formed of polysilicon or amorphous silicon, and may further be formed of various organic semiconductor materials, such as pentacene.

Figure 7:
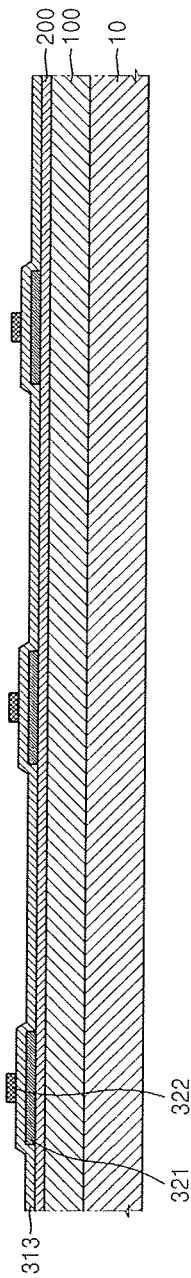

Referring to FIG. 7, the gate insulating layer 313 is formed on the buffer layer 200 to cover the semiconductor layer 321. The gate insulating layer 313 may be formed of an insulating material, such as silicon oxide or silicon nitride, and may also be formed of an insulating organic material.

Next, the gate electrode 322 is formed on the gate insulating layer 313. The gate electrode 322 may be formed of various conductive materials.

Figure 8:
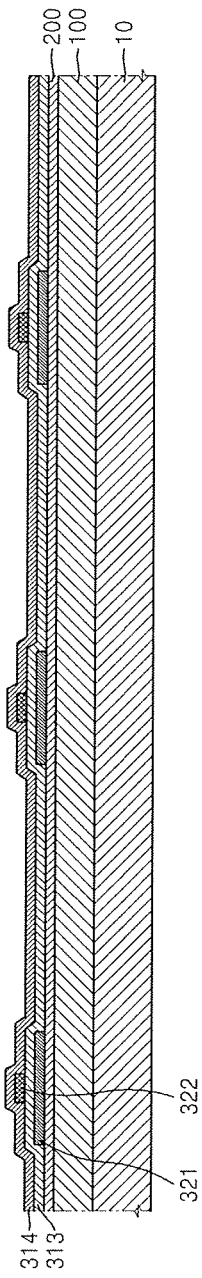

Referring to FIG. 8, the interlayer insulating layer 314 is formed on the gate insulating layer 313 to cover the gate electrode 322.

The interlayer insulating layer 314 may be formed of an insulating material, such as silicon oxide or silicon nitride, and may also be formed of an insulating organic material.

Figure 9:
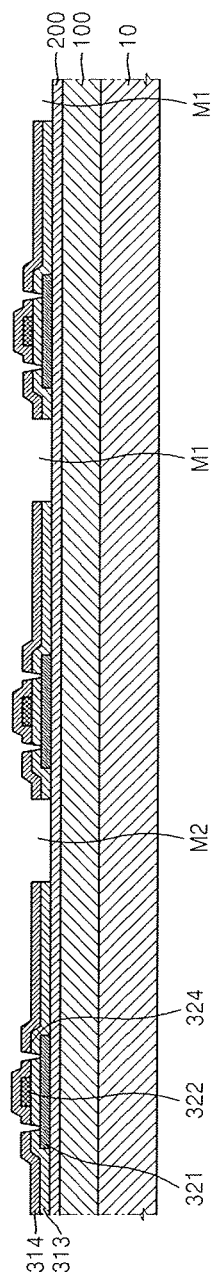

Referring to FIG. 9, the contact hole 324 is formed by a photolithography process. The interlayer insulating layer 314 and the gate insulating layer 313 are selectively removed so that regions of the buffer layer 200 corresponding to the first region M1 and the second region M2 are exposed.

Figure 10:
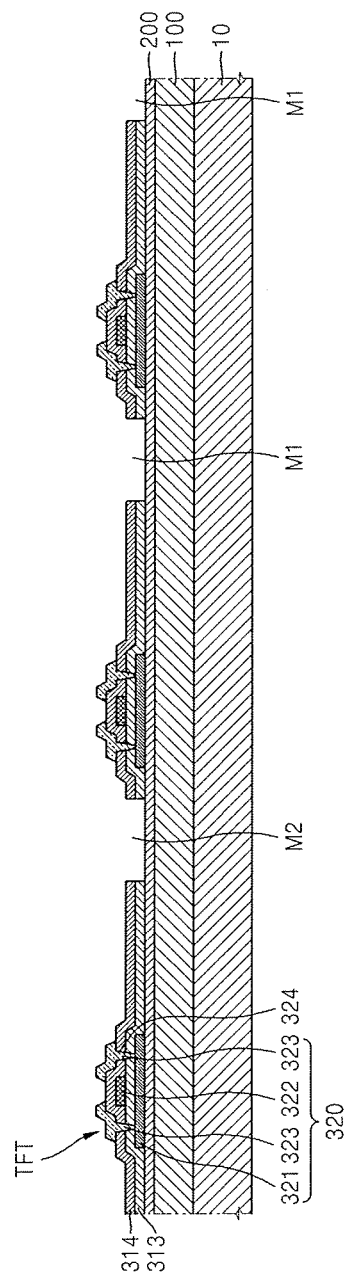

Referring to FIG. 10, through the contact hole 324, the source and drain electrodes 323 are formed on the interlayer insulating layer 314 as a single layer or multiple layers using the gate electrode material described above.

Figure 11:
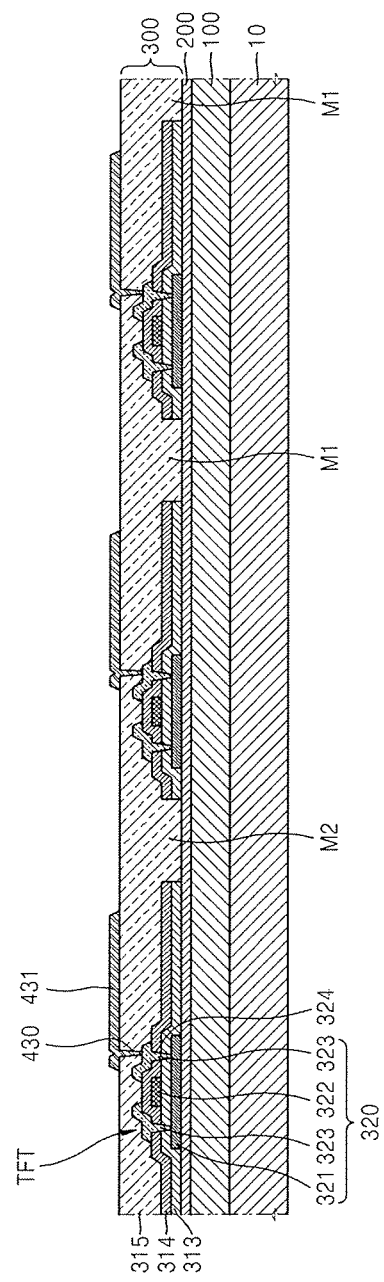

Referring to FIG. 11, to protect and planarize the TFT below, the planarization layer 315 is disposed on the source and drain electrodes 323 and in the first and second regions M1 and M2 exposing part of the buffer layer 200.

Next, a display element is formed on the top of the TFT. The present embodiment includes an organic light-emitting diode (OLED) as the display element. However, embodiments of the present invention are not limited thereto, and various display elements may be formed.

To form the OLED on the top of the TFT, the first electrode 431 is formed on the top of the planarization layer 315, and the first electrode 431 is electrically connected to one of the source and drain electrodes 323 through the contact hole 430. The first electrode 431 serves as an anode or a cathode, and may be formed of various conductive materials.

Figure 12:
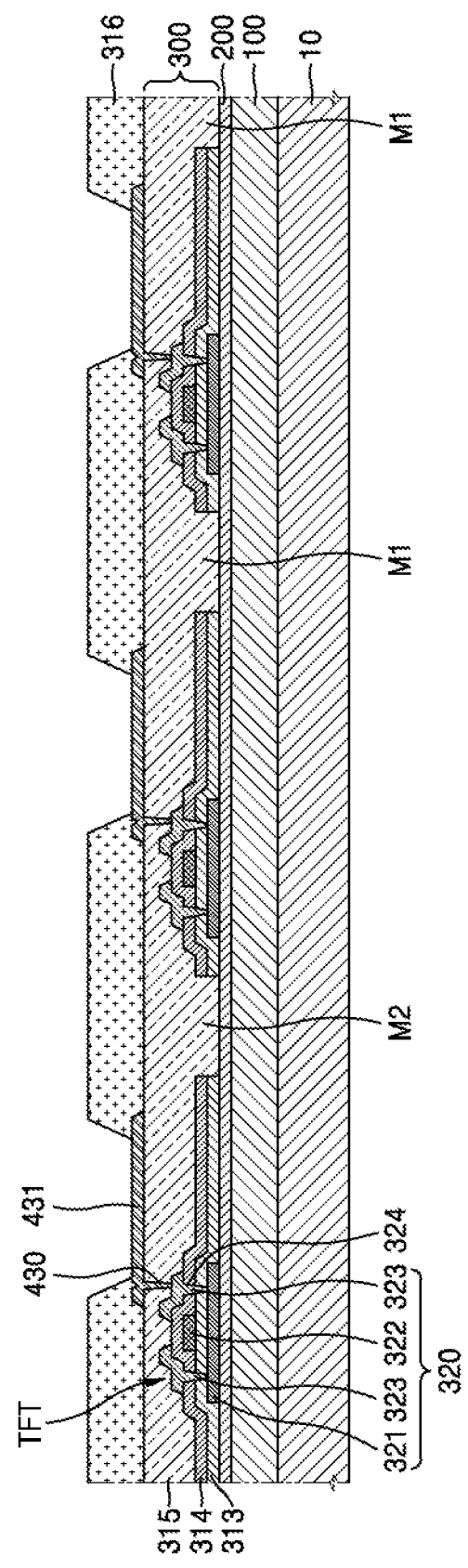

Referring to FIG. 12, a pixel-defining layer 316 is formed on the first electrode 431 by patterning an insulating material in such a way that at least a portion of the first electrode 431 is exposed. The pixel-defining layer 316 may be an inorganic layer formed of inorganic materials, such as silicon oxide (SiO2) and silicon nitride (SiNx).

Figure 13:
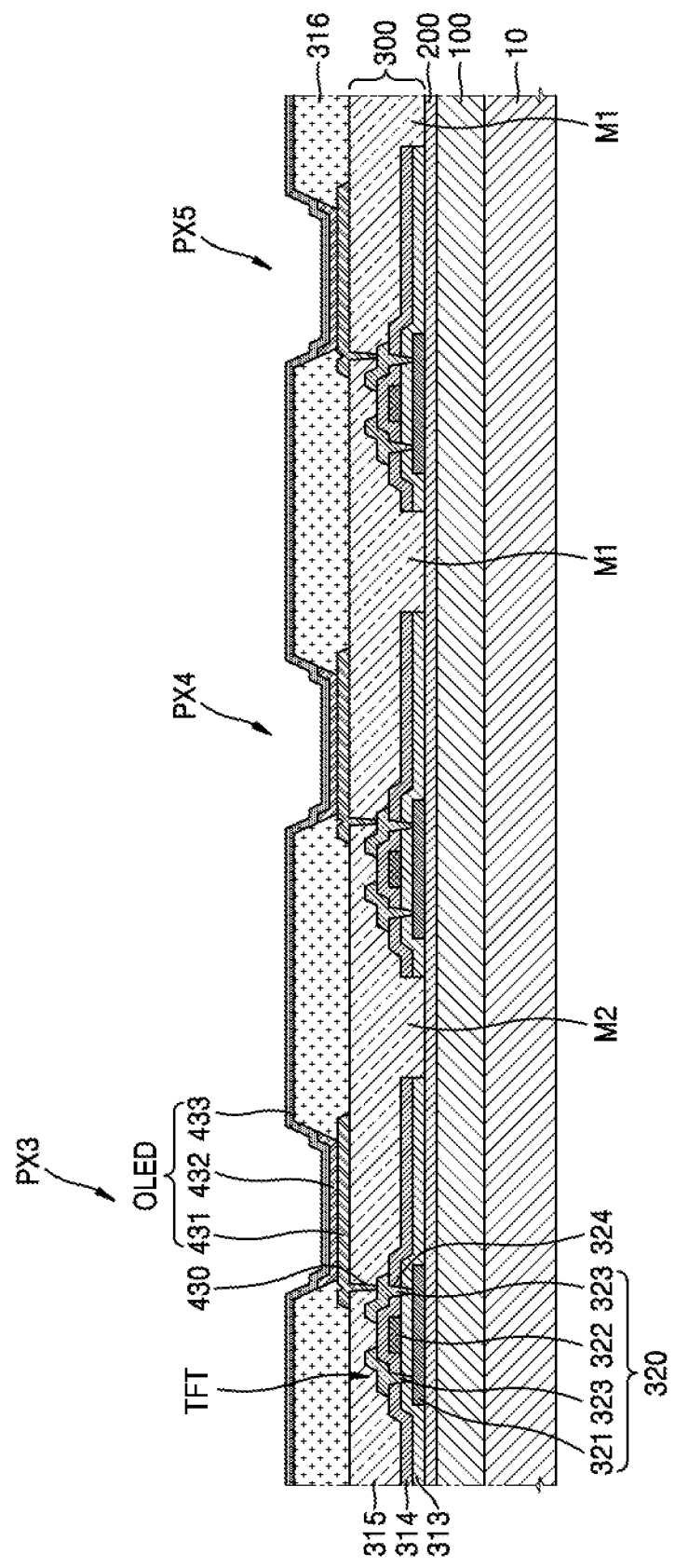

Referring to FIG. 13, the OLED may be manufactured by forming the intermediate layer 432 and the second electrode 433. The intermediate layer 432 includes an organic emission layer in an opening of the first electrode 431. The second electrode 433 faces the first electrode 431. The intermediate layer 432 is interposed between the first electrode 432 and the second electrode 433.

FIG. 13 illustrates that the intermediate layer 432 is patterned to correspond only to each sub-pixel, that is, each of the first electrodes 431 that are patterned. However, this is only for describing a composition of a sub-pixel, and the intermediate layer 432 may be formed as one with the intermediate layer 432 of an adjacent sub-pixel. Also, various alterations are possible, for example, some intermediate layer 432 are formed corresponding to each sub-pixel, and other intermediate layers 432 may be formed as one with intermediate layers 432 of adjacent sub-pixels.

The second electrode 433 may be a cathode or an anode according to a function of the first electrode 431.

Figure 14:
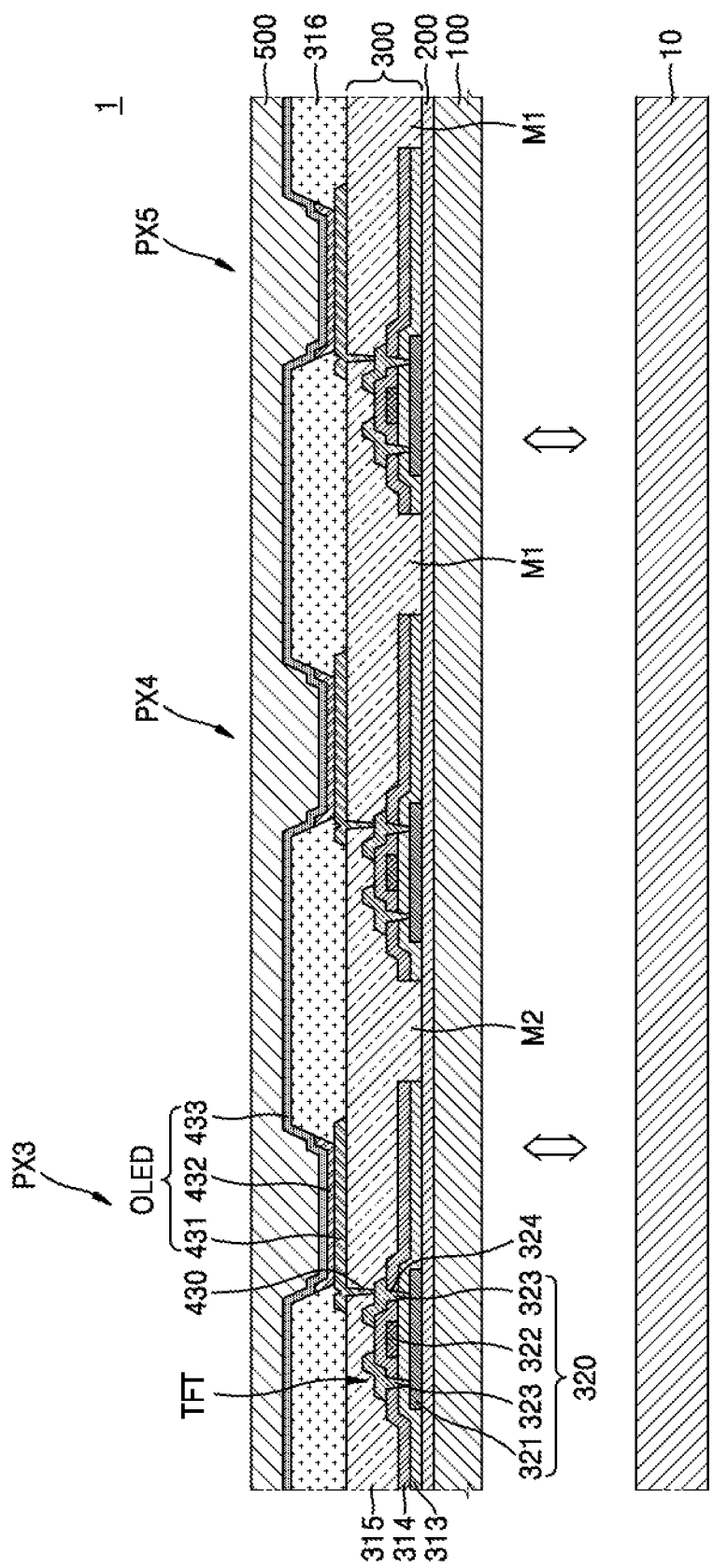

Referring to FIG. 14, the sealing layer 500 is formed on the top of the second electrode 433 to encapsulate the OLED. The sealing layer 500 may be a barrier layer of an inorganic material, an organic material, or a complex stacked material of an organic and inorganic material.

Next, a delaminating process is performed to detach the flexible substrate 100 from the support substrate 10.

Figure 15:
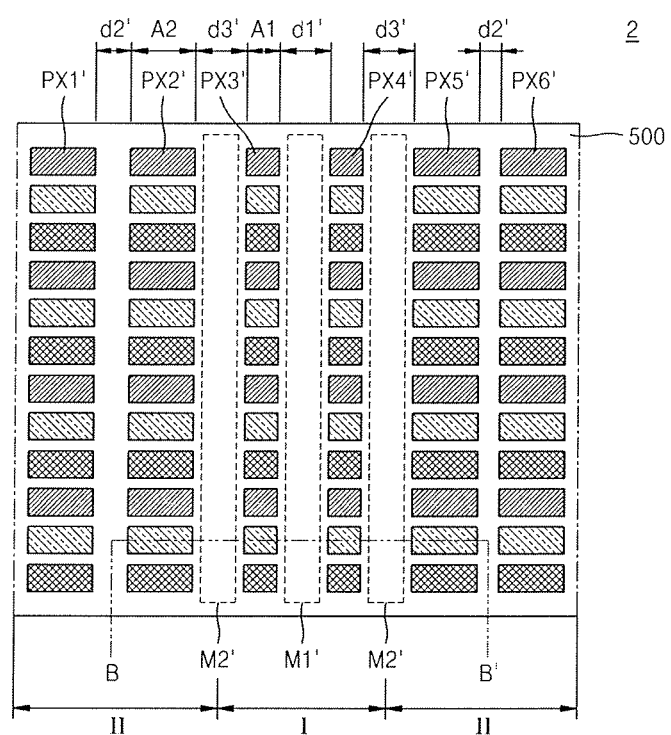
FIG. 15 is a plan view of a flexible display device according to an exemplary embodiment of the present invention.
Figure 16:
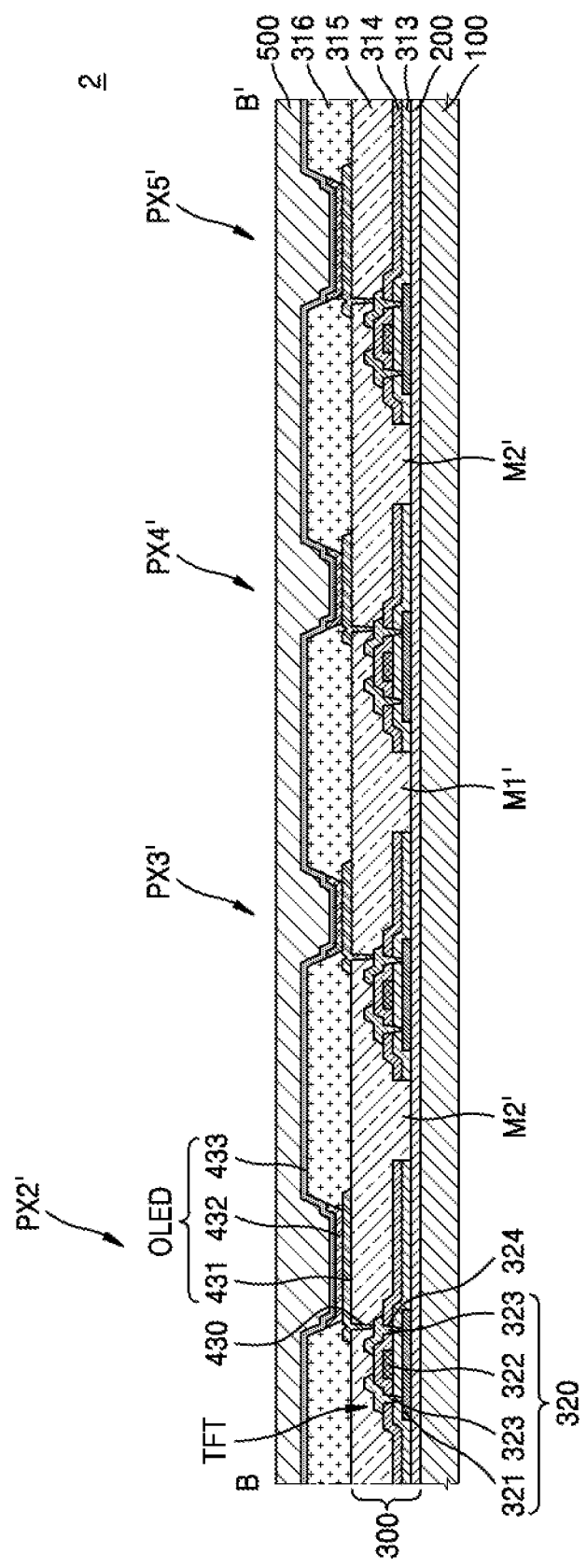
FIG. 16 is a cross-sectional view taken along line B-B' of FIG. 15.

FIG. 15 is a plan view of a flexible display device 2 according to an exemplary embodiment of the present invention. FIG. 16 is a cross-sectional view taken along line B-B' of FIG. 15. Like reference numerals refer to like elements.

Referring to FIGS. 15 and 16, a size A1 of pixels PX3' and PX4' of the bending region I is smaller than a size A2 of pixels PX1', PX2', PX5', and PX6' of the non-bending region II, which is the difference from the embodiment of FIG. 2, wherein the size of the pixels PX1 to PX9 formed in the bending region I and the non-bending region II is materially the same.

A third distance d3' between the pixel PX3' of the bending region I and the pixel PX2' of the non-bending region II may be greater than a second distance d2' between the pixels PX1', PX2', PX5', and PX6'. Also, the third distance d3' may be the same or may be less than a first distance d1' between the pixels PX3' and PX4'. However, the embodiment of the present invention is not limited thereto.

In FIGS. 15 and 16, a first region M1' is a region from which the gate and the interlayer insulating layers 313 and 314 are removed in the bending region I, and a second region M2' is a region from which the gate and the interlayer insulating layers 313 and 314 are removed in a boundary portion of the bending region I and the non-bending region II.

The first distance d1' and the third distance d3' that are greater than the second distance d2' may be obtained by forming the size A1 of the pixels PX3' and PX4' of the bending region I to be smaller than the size A2 of the pixels PX1', PX2', PX5', and PX6' of the non-bending region II. Such pixel size difference may provides a process margin for removing the gate and the interlayer insulating layers 313 and 314 from regions underneath between the pixels PX3' and PX4' of the bending region I. By removing the gate and the interlayer insulating layers 313 and 314 in the first region M1' or the second region M2', stress intensity occurring when the flexible display device 2 is folded or bent may be minimized, thereby increasing the reliability of the flexible display device 2.

For simplicity of description, 2 pixels of the bending region I and 4 pixels of the non-bending region II are described. However, the present invention is not limited thereto, and the number of pixels may vary according to a size of the flexible display device 2, and an area and a folding degree of the bending region I.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A display device comprising:
   a substrate having a non-bending region and a bending region, and bent along a base line extending in a first direction in the bending region;
   a first thin film transistor and a second thin film transistor disposed in the non-bending region, and a third thin film transistor and a fourth thin film transistor disposed in the bending region of the substrate;
   a first pixel electrode electrically connected to the first thin film transistor, a second pixel electrode electrically connected to the second thin film transistor, a third pixel electrode electrically connected to the third thin film transistor, and a fourth pixel electrode electrically connected to the fourth thin film transistor;
   a first organic emission layer disposed on the first pixel electrode, a second organic emission layer disposed on the second pixel electrode, a third organic emission layer disposed on the third pixel electrode, and a fourth organic emission layer disposed on the fourth pixel electrode; and
   a pixel defining layer having a first opening exposing a portion of the first pixel electrode, a second opening exposing a portion of the second pixel electrode, a third opening exposing a portion of the third pixel electrode, and a fourth opening exposing a portion of the fourth pixel electrode,
   wherein a first light-emitting area of the first organic emission layer is defined by the first opening, a second light-emitting area of the second organic emission layer is defined by the second opening, a third light-emitting area of the third organic emission layer is defined by the third opening, and a fourth light-emitting area of the fourth organic emission layer is defined by the fourth opening,
   wherein the first organic emission layer and the second organic emission layer are disposed in the non-bending region to be apart from each other by a first distance in a second direction intersecting the first direction, and the third organic emission layer and the fourth organic emission layer are disposed in the bending region to be apart from each other by a second distance that is greater than the first distance in the second direction,
   an area of the bending region is smaller than an area of the non-bending region,
   the first light-emitting area of the first organic emission layer and the third light-emitting area of the third organic emission layer are the same in size, and
   the second light-emitting area of the second organic emission layer and the fourth light-emitting area of the fourth organic emission layer are the same in size.

2. The display device of claim 1,
   wherein the first organic emission layer to the fourth organic emission layer are sequentially arranged along the second direction, the second organic emission layer and the third organic emission layer are spaced apart from each other by a third distance in the second direction,
   wherein the third distance is greater than the first distance, and less than or equal to the second distance.

3. The display device of claim 1, further comprising:
   an inorganic insulating layer interposed between the substrate, and the third pixel electrode and the fourth pixel electrode.

4. The display device of claim 3,
   wherein the first thin film transistor comprises;
   a semiconductor layer arranged on the substrate;
   a gate electrode arranged on the semiconductor layer; and
   a source electrode or a drain electrode arranged on the gate electrode,
   wherein the inorganic insulating layer comprises a gate insulating layer interposed between the semiconductor layer and the gate electrode and an interlayer insulating layer interposed between the gate electrode and the source electrode or the drain electrode.

5. The display device of claim 4,
   wherein the gate insulating layer and the interlayer insulating layer are removed in a region between the third pixel electrode and the fourth pixel electrode in the first direction.

6. The display device of claim 3,
   wherein the inorganic insulating layer is removed in a region between the third pixel electrode and the fourth pixel electrode in the first direction.

7. The display device of claim 6,
wherein the first thin film transistor comprises;
- a semiconductor layer arranged on the substrate;
- a gate electrode arranged on the semiconductor layer; and
- a source electrode or a drain electrode arranged on the gate electrode,
- wherein the inorganic insulating layer comprises a gate insulating layer interposed between the semiconductor layer and the gate electrode and an interlayer insulating layer interposed between the gate electrode and the source electrode or the drain electrode.

8. A display device comprising:
- a substrate having a non-bending region and a bending region, and bent along a base line extending in a first direction in the bending region;
- a first thin film transistor and a second thin film transistor disposed in the non-bending region, and a third thin film transistor and a fourth thin film transistor disposed in the bending region of the substrate;
- a first pixel electrode electrically connected to the first thin film transistor, a second pixel electrode electrically connected to the second thin film transistor, a third pixel electrode electrically connected to the third thin film transistor, and a fourth pixel electrode electrically connected to the fourth thin film transistor;
- a first organic emission layer disposed on the first pixel electrode, a second organic emission layer disposed on the second pixel electrode, a third organic emission layer disposed on the third pixel electrode, and a fourth organic emission layer disposed on the fourth pixel electrode,
- wherein the first organic emission layer and the second organic emission layer are disposed in the non-bending region to be apart from each other by a first distance in a second direction intersecting the first direction, and the third organic emission layer and the fourth organic emission layer are disposed in the bending region to be apart from each other by a second distance that is greater than the first distance in the second direction, and
- wherein sizes of the third organic emission layer and the fourth organic emission layer are less than sizes of the first organic emission layer and the second organic emission layer; and
- an inorganic insulating layer interposed between the substrate, and the third pixel electrode and the fourth pixel electrode,
- wherein the inorganic insulating layer is removed in a region between the third pixel electrode and the fourth pixel electrode in the first direction.

9. The display device of claim 8,
wherein the first thin film transistor comprises;
- a semiconductor layer arranged on the substrate;
- a gate electrode arranged on the semiconductor layer; and
- a source electrode or a drain electrode arranged on the gate electrode.

10. The display device of claim 9,
wherein the inorganic insulating layer comprises a gate insulating layer interposed between the semiconductor layer and the gate electrode and an interlayer insulating layer interposed between the gate electrode and the source electrode or the drain electrode.

* * * * *